US012660204B2

(12) United States Patent
Lin et al.

(10) Patent No.: US 12,660,204 B2
(45) Date of Patent: Jun. 16, 2026

(54) ONE TRANSISTOR-TWO RRAM STRUCTURE AND FABRICATING METHOD OF THE SAME

(71) Applicant: United Semiconductor (Xiamen) Co., Ltd., Xiamen (CN)

(72) Inventors: Weikun Lin, Shamen City (CN); Wen Yi Tan, Xiamen (CN); Bin Yao, Xiamen (CN); Dejin Kong, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 218 days.

(21) Appl. No.: 18/752,767

(22) Filed: Jun. 24, 2024

(65) Prior Publication Data

US 2025/0374558 A1     Dec. 4, 2025

(30) Foreign Application Priority Data

May 28, 2024     (CN) .......................... 202410674372.6

(51) Int. Cl.
*G11C 11/00*          (2006.01)
*H10B 63/00*          (2023.01)
*H10B 80/00*          (2023.01)

(52) U.S. Cl.
CPC ............. *H10B 63/30* (2023.02); *H10B 63/84* (2023.02); *H10B 80/00* (2023.02)

(58) Field of Classification Search
CPC ........ H10B 63/30; H10B 63/84; H10B 80/00; H10B 63/80; H10N 70/826; H10N 70/8833
USPC ........................................................ 365/148
See application file for complete search history.

(56) References Cited

U.S. PATENT DOCUMENTS

| | | | | |
|---|---|---|---|---|
| 9,391,119 B2 * | 7/2016 | Chen | ...................... | H10B 61/22 |
| 10,096,653 B2 * | 10/2018 | Narayanan | ........... | H10N 70/011 |
| 10,461,126 B2 * | 10/2019 | Tsai | ...................... | H10B 63/30 |
| 10,504,963 B2 * | 12/2019 | Yang | .................. | G11C 13/0011 |

* cited by examiner

*Primary Examiner* — Tha-O H Bui
(74) *Attorney, Agent, or Firm* — Winston Hsu

(57) ABSTRACT

A one transistor-two RRAM structure includes a substrate. A transistor is disposed on the substrate. The transistor includes a first source/drain doped region embedded in the substrate at one side of the transistor. A first source/drain plug, a first metal line, a first plug, a second metal line, a second lower plug, a second RRAM and a second upper metal line are stacked from bottom to top in listed sequence. The first source/drain plug contacts the first source/drain doped region. A first lower plug, a first RRAM and a first upper metal line are stacked from bottom to top in listed sequence. The first lower plug contacts the first metal line.

18 Claims, 7 Drawing Sheets

ONE TRANSISTOR-TWO RRAM STRUCTURE AND FABRICATING METHOD OF THE SAME

BACKGROUND OF THE INVENTION

1. Field of the Invention

The present invention relates to a resistive random access memory (RRAM) structure, and more particularly to a one transistor-two RRAM structure.

2. Description of the Prior Art

Resistive random access memory (RRAM) is a type of non-volatile memory that has following advantages including small memory cell size, ultra-high-speed operation, low-power operation, high endurance, and CMOS compatibility.

The main operating principle of RRAM is by changing the resistance of metal oxide with the external bias voltage to produce different resistance state to store data. The digital information can be determined by high or low resistance state of RRAMs.

With the development of artificial intelligence and 5G, the requirements for the computing performance of chips have increased significantly. However, the size of RRAM has its physical limitations. Except by shrinking RRAMs, other ways to increase the density of RRAMs need to be developed to increase the computing performance and speed of chips.

SUMMARY OF THE INVENTION

In view of this, the present invention uses a 3D stacking method to form a one transistor-two RRAM structure to increase density of RRAMs.

According to a preferred embodiment of the present invention, a one transistor-two RRAM structure includes a substrate including a logic circuit region and a memory region. A transistor is disposed within the memory region on the substrate, wherein the transistor includes a first source/drain doped region embedded in the substrate at one side of the transistor. A first source/drain plug, a first metal line, a first plug, a second metal line, a second lower plug, a second RRAM and a second upper metal line stacked from bottom to top in a listed sequence, wherein the first source/drain plug contacts the first source/drain doped region and a first lower plug, a first RRAM and a first upper metal line stacked from bottom to top in a listed sequence, wherein the first lower plug contacts the first metal line, a bottom surface of the first lower plug is aligned with a bottom surface of the first plug, and a top surface of the first upper metal line is aligned with a top surface of the second metal line.

According to another preferred embodiment of the present invention, a fabricating method of one transistor-two RRAM structure includes providing a substrate including a logic circuit region and a memory region. Then, a one transistor-two RRAM structure is formed, wherein the one transistor-two RRAM structure includes a transistor disposed within the memory region on the substrate, wherein the transistor includes a first source/drain doped region embedded in the substrate at one side of the transistor. A first source/drain plug, a first metal line, a first plug, a second metal line, a second lower plug, a second RRAM and a second upper metal line are stacked from bottom to top in a listed sequence, wherein the first source/drain plug contacts the first source/drain doped region. A first lower plug, a first RRAM and a first upper metal line are stacked from bottom to top in a listed sequence, wherein the first lower plug contacts the first metal line, a bottom surface of the first lower plug is aligned with a bottom surface of the first plug, and a top surface of the first upper metal line is aligned with a top surface of the second metal line.

According to yet another preferred embodiment of the present invention, a layout of one transistor-two RRAM structure includes a substrate. A transistor is disposed on the substrate. A first intermetal dielectric layer (IMD) covers the substrate. A second IMD covers and contacts the first IMD. A first RRAM, a second RRAM, a third RRAM and a fourth RRAM are arranged in a 2×2 array, wherein the first RRAM, the second RRAM, the third RRAM and the fourth RRAM are entirely embedded in the first IMD. A conductive element is disposed at the center of the 2×2 array and penetrates through the first IMD. A fifth RRAM is entirely embedded in the second IMD. A first lower plug is disposed below the fifth RRAM and contacts the fifth RRAM. The conductive element contacts the first lower plug, and the transistor, the first RRAM and the fifth RRAM together form a one transistor-two RRAM structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
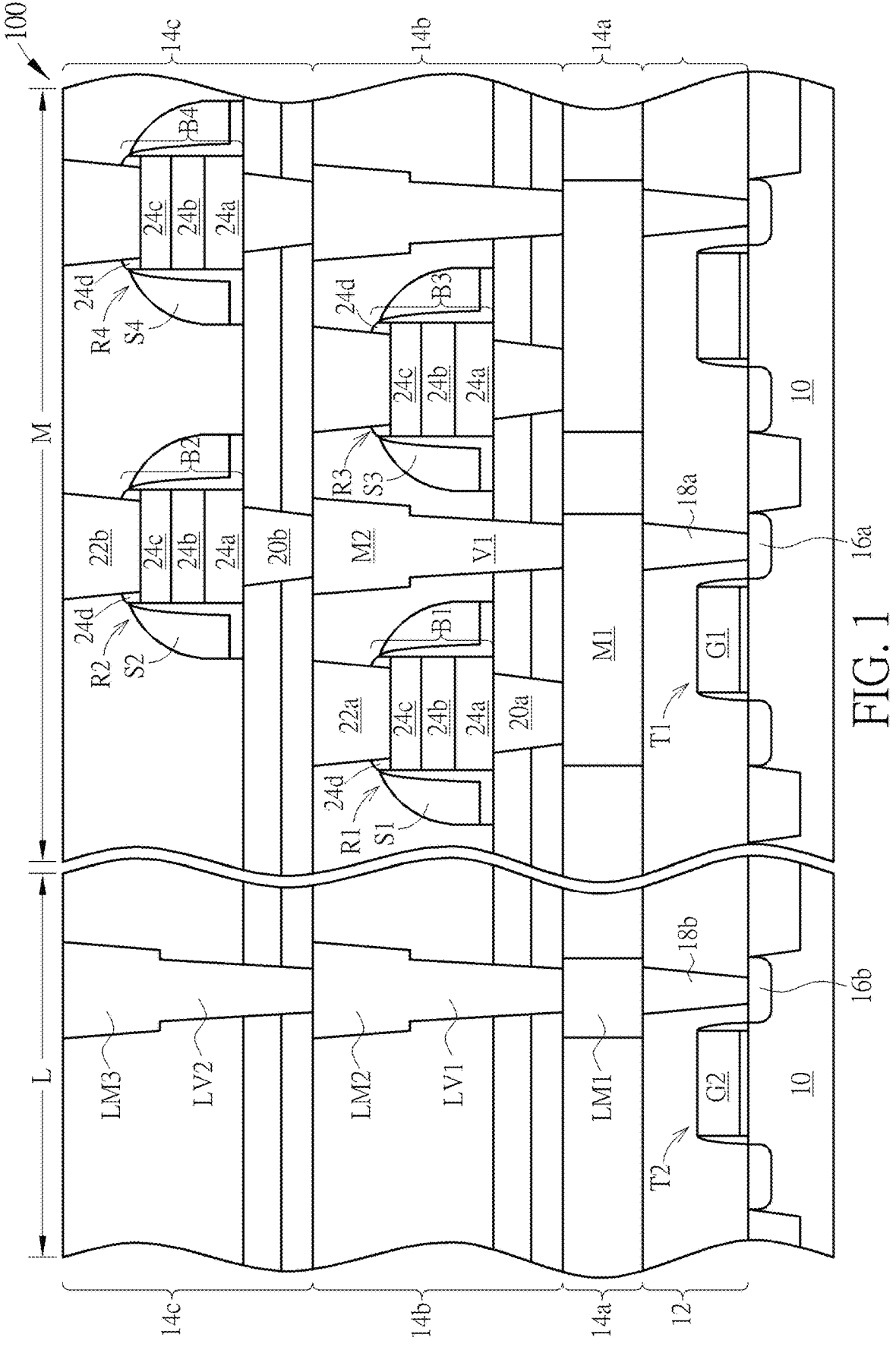
FIG. 1 depicts a one transistor-two RRAM structure according to a first preferred embodiment of the present invention.

FIG. 1 depicts a one transistor-two resistive random access memory (RRAM) structure according to a first preferred embodiment of the present invention.

As shown in FIG. 1, a one transistor-two RRAM structure includes a substrate 10. The substrate 10 may include a silicon substrate, a germanium substrate, a gallium arsenide substrate, a silicon germanium substrate, an indium phosphide substrate, a gallium nitride substrate, a silicon carbide substrate or a silicon-on-insulator substrate. The substrate 10 is divided into a logic circuit region L and a memory region M. A dielectric layer 12, a first intermetal dielectric layer (IMD) 14a, a second IMD 14b, and a third IMD 14c are stacked on the substrate 10 from bottom to top in a listed sequence. The dielectric layer 12 contacts the first IMD 14a, the first IMD 14a contacts the second IMD 14b, and the second IMD 14b contacts the third IMD 14c.

The first IMD 14a is preferably a single layer of low-k (dielectric constant) material. The second IMD 14b and the third IMD 14c preferably include multiple dielectric layers. For example, the second IMD 14b and the third IMD 14c may be formed by a nitrogen-doped silicon carbide (NDC) layer, a silicon oxide layer and a low-k layer stacked from bottom to top. The dielectric layer 12 is preferably silicon oxide. The aforementioned low-k material layer refers to a layer with a dielectric constant below 3.9, such as SiCOH or other silicon oxide layers containing dopants.

A transistor T1 is disposed on the substrate 10 within the memory region M. The transistor T1 includes a first source/drain doped region 16a embedded in the substrate 10 at one side of the transistor T1. A logic transistor T2 is disposed on the substrate 10 within the logic circuit region L. The logic transistor T2 includes a second source/drain doped region 16b embedded in the substrate 10 at one side of the logic transistor T2. The dielectric layer 12 covers and contacts the gate G1 of the transistor T1 and the gate G2 of the logic transistor T2. A first source/drain plug 18a, a first metal line M1, a first plug V1, a second metal line M2, a second lower plug 20b, a second RRAM R2 and a second upper metal line 22b are stacked from bottom to top in a listed sequence. The first source/drain plug 18a, the first metal line M1, the first plug V1, the second metal line M2, the second lower plug 20b, the second RRAM R2 and the second upper metal line 22b are disposed within the memory region M. The first source/drain plug 18a contacts the first source/drain doped region 16a. In detail, the first metal line M1 contacts the first source/drain plug 18a and the first plug V1. The second metal line M2 contacts the first plug V1. The second RRAM R2 contacts the second lower plug 20b and the second upper metal line 22b. The second lower plug 20b contacts the second metal line M2.

In addition, a first lower plug 20a, a first RRAM R1 and a first upper metal line 22a are stacked from bottom to top in sequence. The first lower plug 20a contacts the first metal line M1. The first RRAM R1 contacts the first lower plug 20a and the first upper metal line 22a. The bottom surface of the first lower plug 20a is aligned with the bottom surface of the first plug V1. The top surface of the first upper metal line 22a is aligned with the top surface of the second metal line M2. The first upper metal line 22a and the second upper metal line 22b are preferably electrically floating. That is, the first upper metal line 22a and the second upper metal line 22b do not electrically connect to outside circuits. The reason why the first upper metal line 22a and the second upper metal line 22b are made is to reduce the loading effect. Because the first upper metal line 22a and the second upper metal line 22b are formed together with other metal lines, the first upper metal line 22a and the second upper metal line 22b can adjust the density of the metal lines to make the distribution of the metal lines more even to reduce the loading effect.

A second source/drain plug 18b, a first logic region metal line LM1, a first logic region plug LV1, a second logic region metal line LM2, a second logic region plug LV2 and a third logic region metal line LM3 are stacked sequentially from bottom to top within the logic circuit region L. The second source/drain plug 18b contacts the second source/drain doped region 16b. The first logic region metal line LM1 contacts the second source/drain plug 18b and the first logic region plug LV1. The second logic region metal line LM2 contacts the first logic region plug LV1. The second logic region plug LV2 contacts the second logic region metal line LM2. The third logic region metal line LM3 contacts the second logic region plug LV2.

The bottom surface of the first lower plug 20a is aligned with the bottom surface of the first logic region plug LV1.

The top surface of the first upper metal line 22a is aligned with the top surface of the second logic region metal line LM2. The top surface of the second upper metal line 22b is aligned with the top surface of the third logic region metal line LM3. The bottom surface of the second lower plug 20b is aligned with the bottom surface of the second logic region plug LV2. The second lower plug 20b, the second RRAM R2, the second upper metal line 22b, the second logic region plug LV2 and the third logic region metal line LM3 are all entirely embedded in the third IMD 14c. The first lower plug 20a, the first RRAM R1, the first upper metal line 22a, the first logic region plug LV1 and the second logic region metal line LM2 are all entirely embedded in the second IMD 14b. The top surface of the second upper metal line 22b, the top surface of the third logic region metal line LM3, and the top surface of the third IMD 14c are aligned with each other. The bottom surface of the second lower plug 20b, the bottom surface of the second logic region plug LV2, and the bottom surface of the third IMD 14c are aligned with each other. The top surface of the first upper metal line 22a, the top surface of the second logic region metal line LM2, and the top surface of the second metal line M2 are aligned with each other. The bottom surface of the first plug V1, the bottom surface of the first lower plug 20a and the bottom surface of the first logic region plug LV1 are aligned with each other. The first metal line M1 is embedded in the first IMD 14a. The top surface of the first metal line M1 is aligned with the top surface of the first IMD 14a, and the bottom surface of the first metal line M1 is aligned with the bottom surface of the first IMD 14a.

The first RRAM R1 and the second RRAM R2 are electrically connected to the transistor T1 respectively. Furthermore, the first RRAM R1 and the second RRAM R2 are not electrically connected to each other. The first RRAM R1, the second RRAM R2 and the transistor T1 together form a one transistor-two RRAM structure.

Moreover, a third RRAM R3 is disposed in the memory region M. The third RRAM R3 is embedded in the second IMD 14b and the third RRAM R3 is adjacent to the first RRAM R1. A fourth RRAM R4 is disposed in the memory region M. The fourth RRAM R4 is embedded in the third IMD 14c and the fourth RRAM R4 is adjacent to the second RRAM R2. The third RRAM R3 and the fourth RRAM R4 belong to another one transistor-two RRAM structure.

The first RRAM R1 includes a first body B1 and a first spacer S1 surrounding the first body B1. The second RRAM R2 includes a second body B2 and a second spacer S2 surrounding the second body B2. The third RRAM R3 includes a third body B3 and a third spacer S3 surrounding the third body B3. The fourth RRAM R4 includes a fourth body B4 and a fourth spacer S4 surrounding the fourth body B4. The first body B1, the second body B2, the third body B3 and the fourth body B4 are respectively formed by a bottom electrode 24a, a variable resistance layer 24b, a top electrode 24c and a cap layer 24d stacked from bottom to top. The top electrode 24c and the bottom electrode 24a may include titanium nitride or tantalum nitride. The variable resistance layer 24b includes aluminum oxide, tantalum oxide or hafnium oxide. The cap layer 24d may be silicon oxide or silicon nitride.

In the first preferred embodiment, the first spacer S1, the second spacer S2, the third spacer S3 and the fourth spacer S4 are all formed by multiple material layers. The first spacer S1, the second spacer S2, the third spacer S3 and the fourth spacer S4 do not contact each other.

In addition, the first source/drain plug 18a, the first metal line M1, the first plug V1, the second metal line M2, the second lower plug 20*b*, the second upper metal line 22*b*, the first lower plug 20*a*, the first upper metal line 22*a*, the second source/drain plug 18*b*, the first logic region metal line LM1, the first logic region plug LV1, the second logic region metal line LM2, the second logic region plug LV2 and the third logic region metal line LM3 may respectively formed by a single layer or multiple layers of conductive material including aluminum, copper, tungsten, titanium, tantalum, titanium nitride or tantalum nitride.

Figure 2:
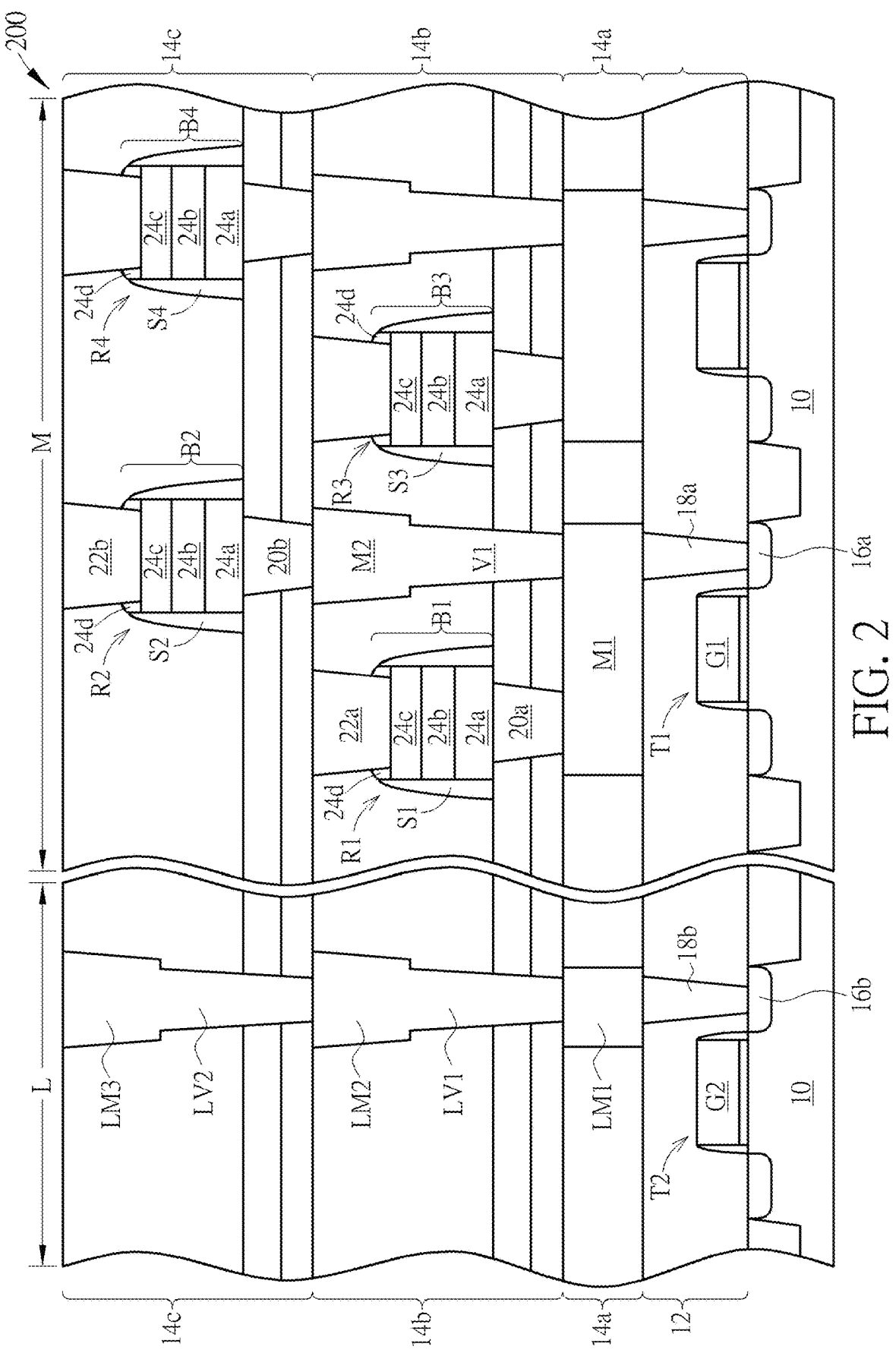
FIG. 2 depicts a one transistor-two RRAM structure according to a second preferred embodiment of the present invention.

As shown in FIG. 2, in the second preferred embodiment, the first spacer S1, the second spacer S2, the third spacer S3 and the fourth spacer S4 of a one transistor-two RRAM structure 200 are all formed by a single material layer. In the structure of the one transistor-two RRAM structure 200 in the second preferred embodiment, except for the number of layers of each of the spacers, other elements are the same as those in the first preferred embodiment, and an accompanying explanation is therefore omitted.

Figure 3:
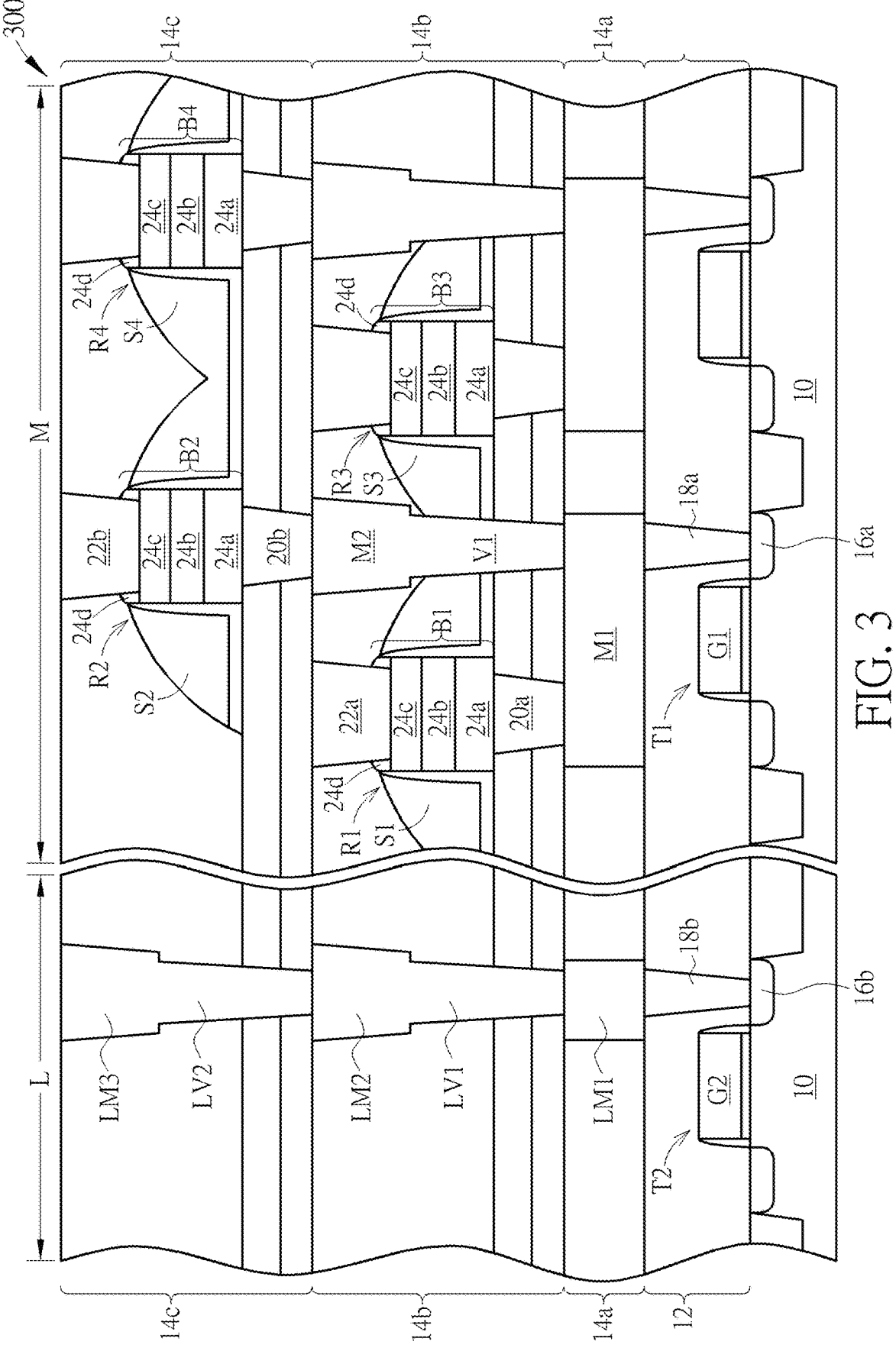
FIG. 3 depicts a one transistor-two RRAM structure according to a third preferred embodiment of the present invention.

As shown in FIG. 3, in the third preferred embodiment, the first spacer S1, the second spacer S2, the third spacer S3 and the fourth spacer S4 of a one transistor-two RRAM structure 300 are all formed by multiple material layers. Moreover, the second spacer S2 contacts the fourth spacer S4. That is, the second spacer S2 connects to the fourth spacer S4. In addition, the first plug V1 penetrates through the position where the first spacer S1 and the third spacer S3 are connected. Therefore, the first plug V1 contacts the first spacer S1 and the third spacer S3. In the third preferred embodiment, except that the spacers are connected to each other, other elements of the one transistor-two RRAM structure 300 are the same as those in the first preferred embodiment, and an accompanying explanation is therefore omitted.

Figure 4:
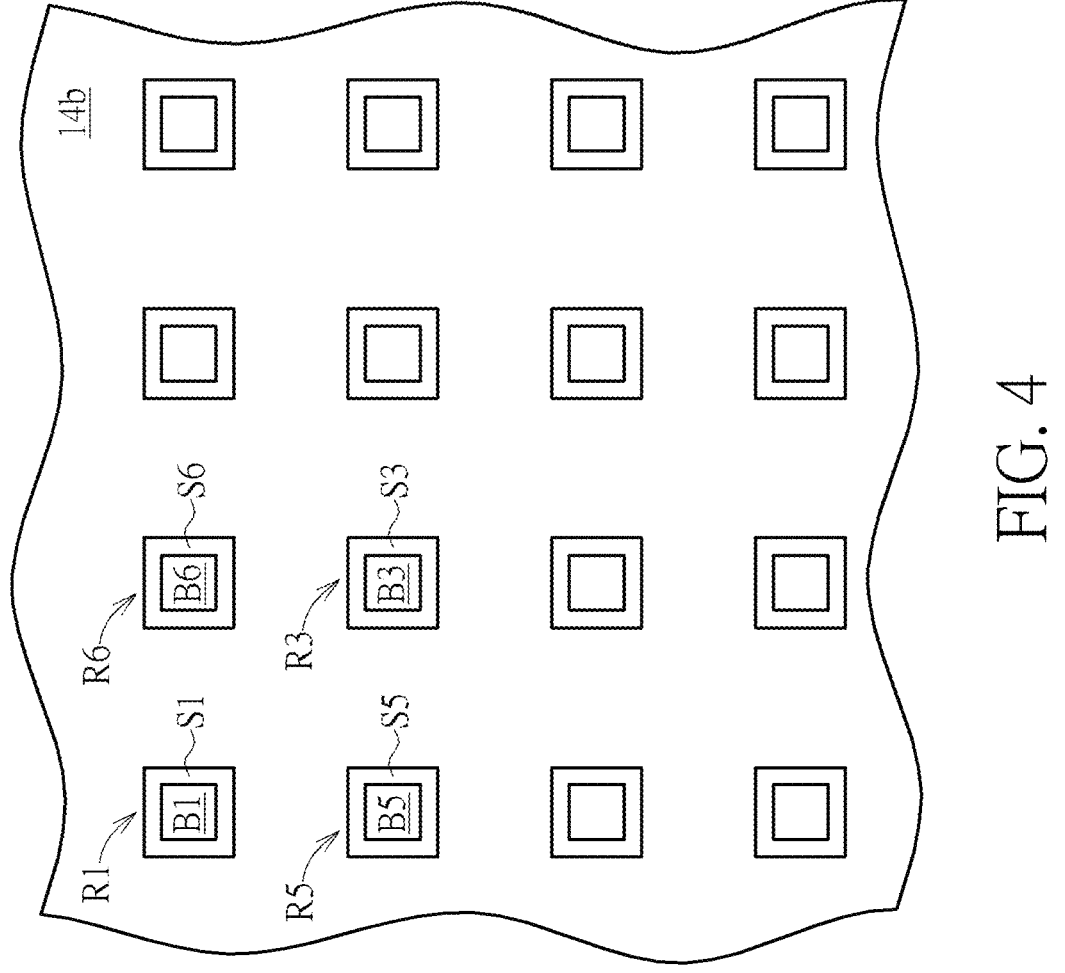
FIG. 4 to FIG. 5 depict a layout of one transistor-two RRAM structure according to a fourth preferred embodiment of the present invention.
Figure 5:
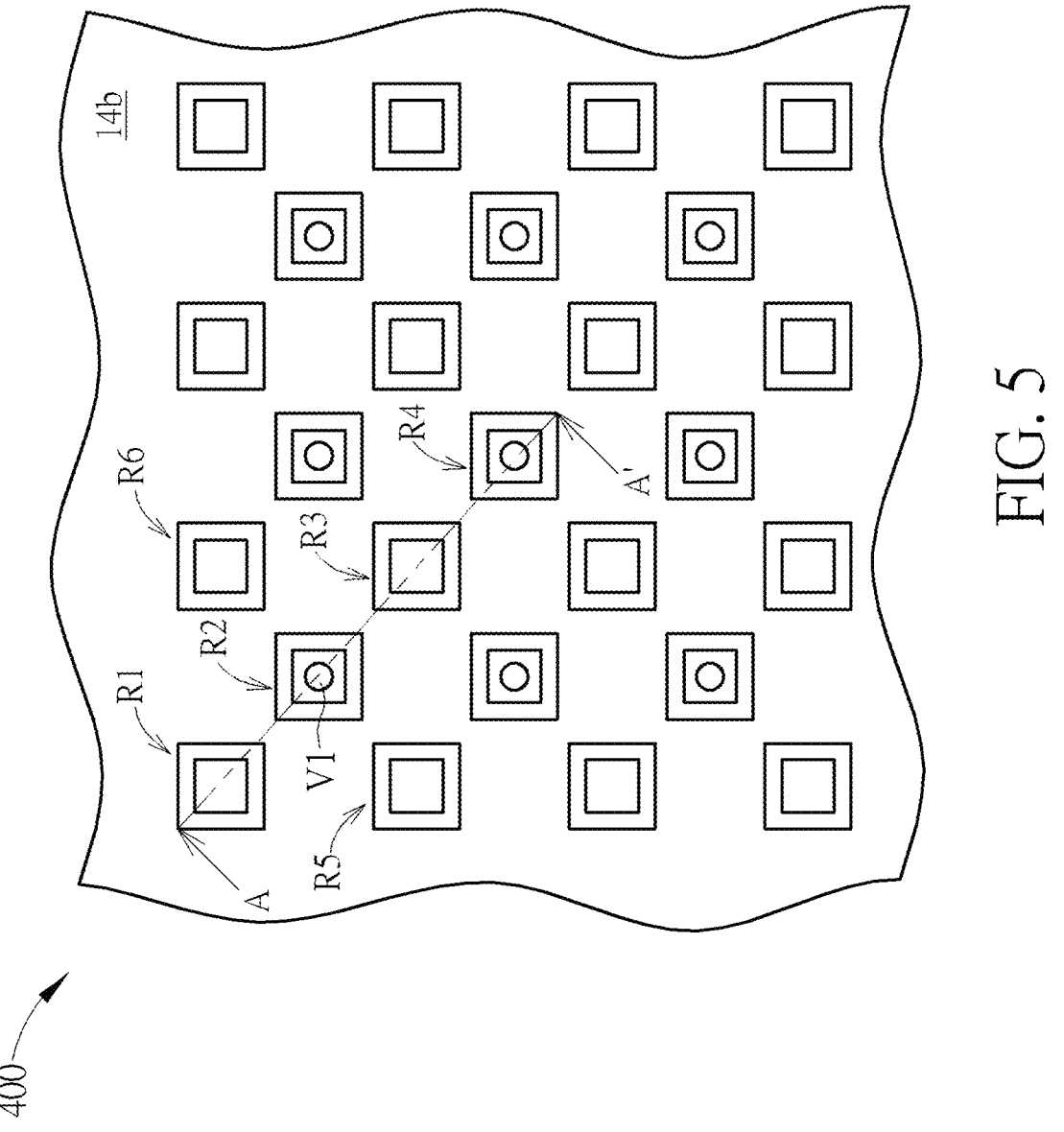

FIG. 4 to FIG. 5 depict a layout of one transistor-two RRAM structure according to a fourth preferred embodiment of the present invention, wherein the memory region in FIG. 1 is a sectional view taken along line AA' in FIG. 5, and elements in FIG. 4 to FIG. 5 which are substantially the same as those in the embodiment of FIG. 1 are denoted by the same reference numerals; an accompanying explanation is therefore omitted As shown in FIG. 1, FIG. 4 and FIG. 5, a layout of one transistor-two RRAM structure 400 includes a substrate 10. A transistor T1 is disposed on the substrate 10, and a second IMD 14*b* covers the substrate 10. A third IMD 14*c* covers and contacts the second IMD 14*b*. Numerous RRAMs are disposed in the second IMD 14*b* on the substrate 10 and are arranged in an array. For example, a first RRAM R1, a third RRAM R3, a fifth RRAM R5 and a sixth RRAM R6 are arranged in a 2×2 array. The first RRAM R1, the third RRAM R3, the fifth RRAM R5 and the sixth RRAM R6 are completely embedded in the second IMD 14*b*. The first RRAM R1 includes a first body B1 and a first spacer S1 surrounding the first body B1. The third RRAM R3 includes a third body B3 and a third spacer S3 surrounding the third body B3. The fifth RRAM R5 includes a fifth body B5 and a fifth spacer S5 surrounding the fifth body B5. The sixth RRAM R6 includes a sixth body B6 and a sixth spacer S6 surrounding the sixth body B6. The first spacer S1, the third spacer S3, the fifth spacer S5 and the sixth spacer S6 do not contact each other.

A conductive element, such as the first plug V1 and the second metal line M2, is disposed in the center of the 2×2 array and penetrates through the second IMD 14*b*. A second RRAM R2 is completely embedded in the third IMD 14*c*. A second lower plug 20*b* is disposed below the second RRAM R2 and contacts the second RRAM R2. The conductive element contacts the second lower plug 20*b*. The transistor T1, the first RRAM R1 and the second RRAM R2 together form a one transistor-two RRAM structure. The transistor T1 respectively electrically connects to the first r RRAM R1 and the second RRAM R2.

Figure 6:
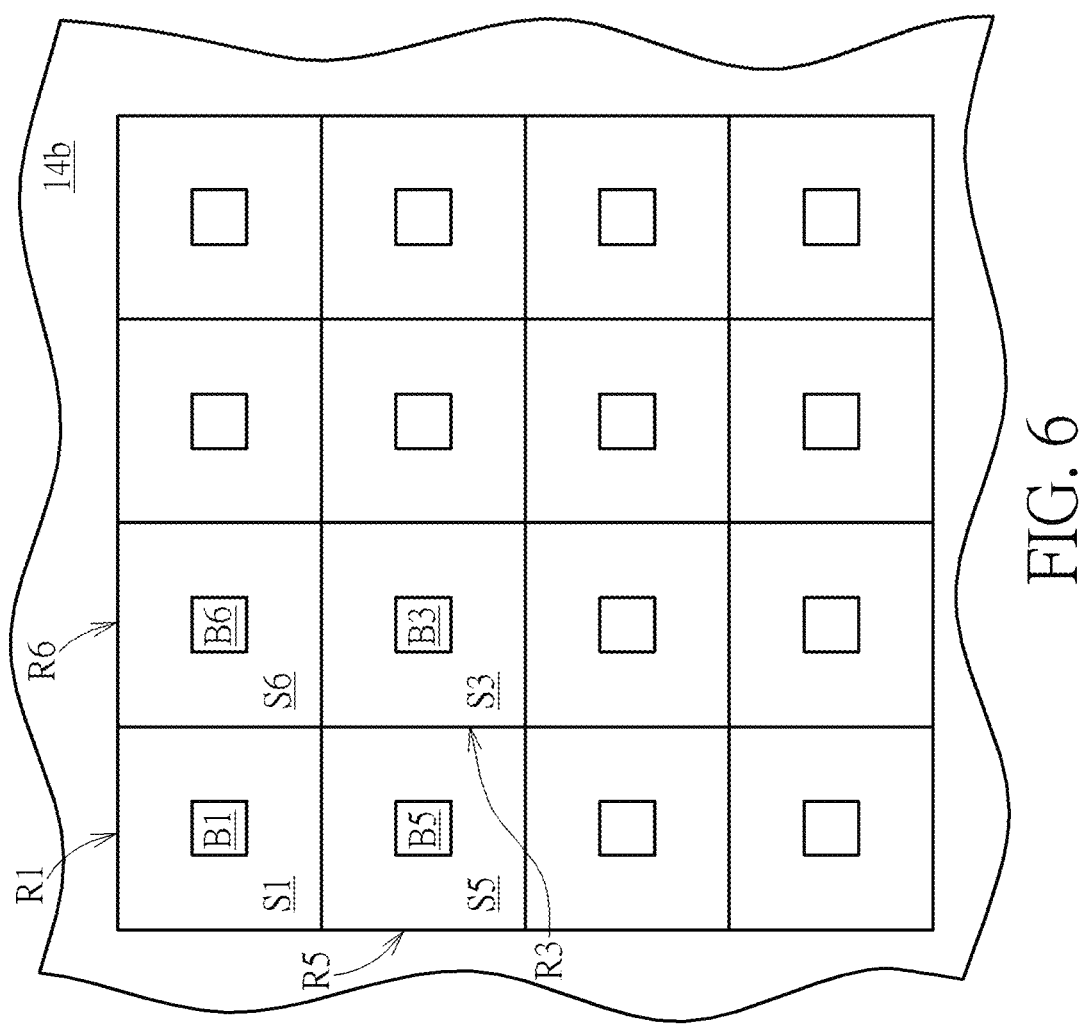
FIG. 6 to FIG. 7 depict a layout of one transistor-two RRAM structure according to a fifth preferred embodiment of the present invention.
Figure 7:
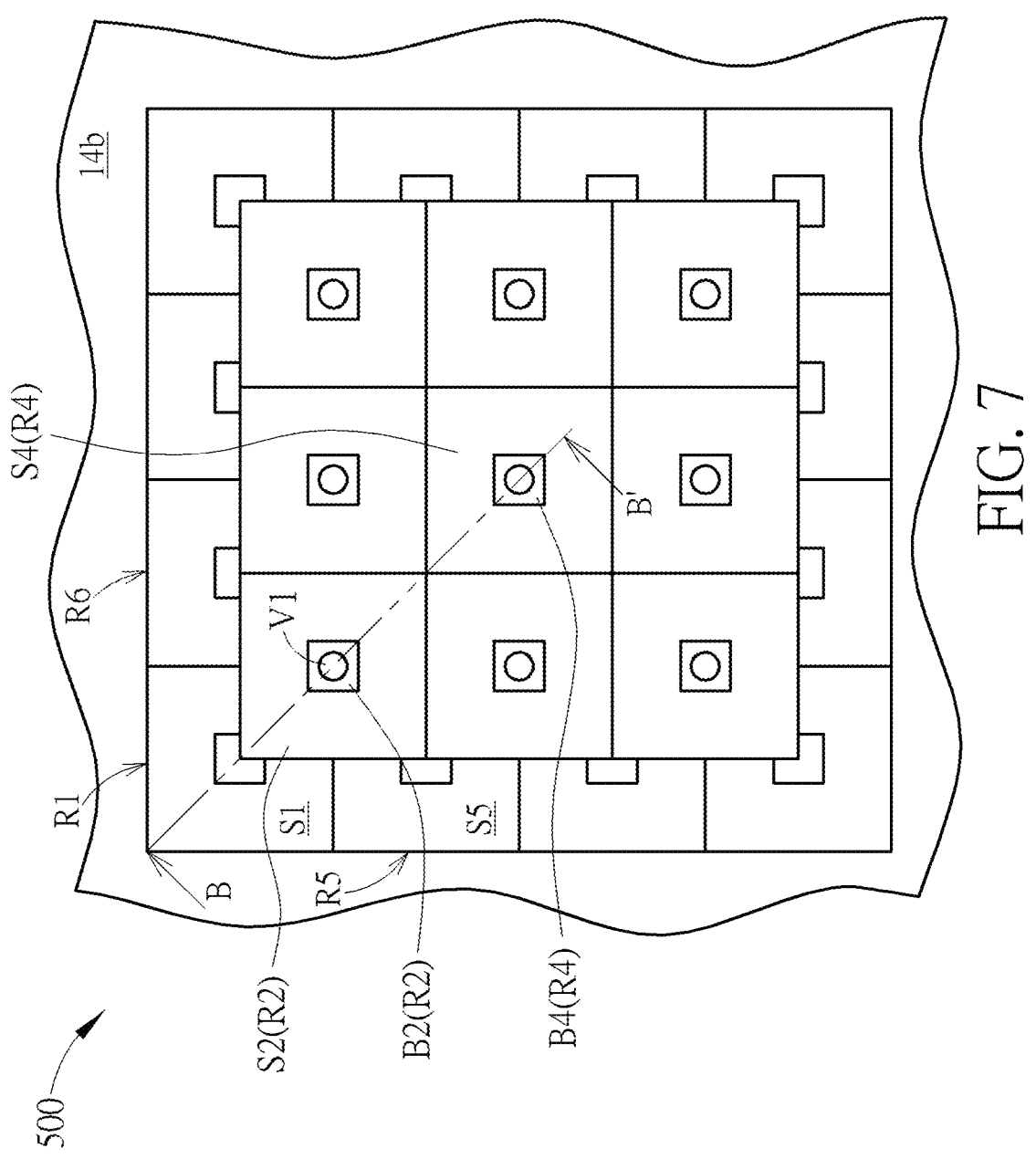

FIG. 6 to FIG. 7 depict a layout of one transistor-two RRAM structure according to a fifth preferred embodiment of the present invention, wherein the memory region in FIG. 3 is a sectional view taken along line BB' in FIG. 7, and elements in FIG. 6 to FIG. 7 which are substantially the same as those in the embodiment of FIG. 3 are denoted by the same reference numerals; an accompanying explanation is therefore omitted The difference between the fifth preferred embodiment and the fourth preferred embodiment is that in the layout of one transistor-two RRAM structure 500, the first spacer S1 is connected to the sixth spacer S6 and the fifth spacer S5. The third spacer S3 is connected to the fifth spacer S5 and the sixth spacer S6. Therefore, the conductive element penetrates through and contacts the first spacer S1, the third spacer S3, the fifth spacer S5 and the sixth spacer S6. Other elements of the layout of one transistor-two RRAM structure 500 are the same as those in the fourth preferred embodiment, and an accompanying explanation is therefore omitted.

As shown in FIG. 1, a fabricating method of one transistor-two RRAM structure of the present invention includes providing a substrate. Then, a transistor T1 and a logic transistor T2 are formed on the substrate 10. Later, a dielectric layer 12, a first IMD 14*a*, a second IMD 14*b* and a third IMD 14*c* are formed. Between the processes of forming the dielectric layer 12, the first IMD 14*a*, the second IMD 14*b* and the third IMD 14*c*, a the first source/drain plug 18*a*, a first metal line M1, a first plug V1, a second metal line M2, a second lower plug 20*b*, a second RRAM R2, a second upper metal line 22*b*, a first lower plug 20*a*, a first RRAM R1 and a first upper metal line 22*a* can be formed within the dielectric layer 12, the first IMD 14*a*, the second IMD 14*b* and the third IMD 14*c* by etching processes, deposition processes and chemical mechanical polishing processes. Furthermore, during the fabricating process of forming elements in the memory region M, a second source/drain plug 18*b*, a first logic region metal line LM1, a first logic region plug LV1, a second logic region metal line LM2, a second logic region plug LV2 and a third logic region metal line LM3 are simultaneously formed in the dielectric layer 12, the first IMD 14*a*, the second IMD 14*b* and the third IMD 14*c* within the logic circuit region L. In addition, profiles of spacers can be changed by adjusting the number of layers and thickness of the spacers. For example, a thicker material layer may be used to form spacers for connecting each other.

In the present invention, a one transistor-two RRAM structure is formed by disposing an RRAM in the third IMD to cooperate with an RRAM disposed in the second IMD. In this way, higher component utilization can be obtained in a smaller area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A one transistor-two resistive random access memory (RRAM) structure, comprising:

a substrate comprising a logic circuit region and a memory region;

a transistor disposed within the memory region on the substrate, wherein the transistor comprises a first source/drain doped region embedded in the substrate at one side of the transistor;

a first source/drain plug, a first metal line, a first plug, a second metal line, a second lower plug, a second RRAM and a second upper metal line stacked from bottom to top in a listed sequence, wherein the first source/drain plug contacts the first source/drain doped region; and a first lower plug, a first RRAM and a first upper metal line stacked from bottom to top in a listed sequence, wherein the first lower plug contacts the first metal line, a bottom surface of the first lower plug is aligned with a bottom surface of the first plug, and a top surface of the first upper metal line is aligned with a top surface of the second metal line.

2. The one transistor-two RRAM structure of claim 1, further comprising:

a logic transistor disposed on the substrate within the logic circuit region, wherein the logic transistor comprises a second source/drain doped region embedded in the substrate at one side of the logic transistor; and a second source/drain plug, a first logic region metal line, a first logic region plug, a second logic region metal line, a second logic region plug and a third logic region metal line stacked from bottom to top in a listed sequence, wherein the second source/drain plug contacts the second source/drain doped region.

3. The one transistor-two RRAM structure of claim 2, wherein the bottom surface of the first lower plug is aligned with a bottom surface of the first logic region plug, the top surface of the first upper metal line is aligned with a top surface of the second logic region metal line, a top surface of the second upper metal line is aligned with a top surface of the third logic region metal line, and a bottom surface of the second lower plug is aligned with a bottom surface of the second logic region plug.

4. The one transistor-two RRAM structure of claim 1, further comprising: a dielectric layer, a first intermetal dielectric (IMD) layer, a second IMD, and a third IMD stacked on the substrate from bottom to top in a listed sequence, wherein the dielectric layer contacts the first IMD, the first IMD contacts the second IMD, and the second IMD contacts the third IMD, and wherein the second lower plug, the second RRAM, the second upper metal line, the second logic region plug and the third logic region metal line are all entirely embedded in the third IMD, and the first lower plug, the first RRAM, the first upper metal line, the first logic region plug and the second logic region metal line are all entirely embedded in the second IMD.

5. The one transistor-two RRAM structure of claim 1, further comprising:

a third RRAM disposed in the memory region, wherein the third RRAM is embedded in the second IMD, and the third RRAM is adjacent to the first RRAM; and a fourth RRAM disposed in the memory region, wherein the fourth RRAM is embedded in the third IMD, and the fourth RRAM is adjacent to the second RRAM.

6. The one transistor-two RRAM structure of claim 5, wherein the second RRAM comprises a second body and a second spacer surrounding the second body, the fourth RRAM comprises a fourth body and a fourth spacer surrounding the fourth body, and the second spacer connects to the fourth spacer.

7. The one transistor-two RRAM structure of claim 5, wherein the first RRAM comprises a first body and a first spacer surrounding the first body, the third RRAM comprises a third body and a third spacer surrounding the third body, and the first plug contacts and penetrates through the first spacer and the third spacer.

8. A fabricating method of one transistor-two resistive random access memory (RRAM) structure, comprising:

providing a substrate comprising a logic circuit region and a memory region;

forming a one transistor-two RRAM structure, wherein the one transistor-two RRAM structure comprises:

a transistor disposed within the memory region on the substrate, wherein the transistor comprises a first source/drain doped region embedded in the substrate at one side of the transistor;

a first source/drain plug, a first metal line, a first plug, a second metal line, a second lower plug, a second RRAM and a second upper metal line stacked from bottom to top in a listed sequence, wherein the first source/drain plug contacts the first source/drain doped region; and a first lower plug, a first RRAM and a first upper metal line stacked from bottom to top in a listed sequence, wherein the first lower plug contacts the first metal line, a bottom surface of the first lower plug is aligned with a bottom surface of the first plug, and a top surface of the first upper metal line is aligned with a top surface of the second metal line.

9. The fabricating method of one transistor-two RRAM structure of claim 8, further comprising:

forming a logic transistor disposed on the substrate within the logic circuit region, wherein the logic transistor comprises a second source/drain doped region embedded in the substrate at one side of the logic transistor; and forming a second source/drain plug, a first logic region metal line, a first logic region plug, a second logic region metal line, a second logic region plug and a third logic region metal line stacked from bottom to top in a listed sequence, wherein the second source/drain plug contacts the second source/drain doped region.

10. The fabricating method of one transistor-two RRAM structure of claim 9, wherein the bottom surface of the first lower plug is aligned with a bottom surface of the first logic region plug, the top surface of the first upper metal line is aligned with a top surface of the second logic region metal line, a top surface of the second upper metal line is aligned with a top surface of the third logic region metal line, and a bottom surface of the second lower plug is aligned with a bottom surface of the second logic region plug.

11. The fabricating method of one transistor-two RRAM structure of claim 8, further comprising: forming a dielectric layer, a first intermetal dielectric (IMD) layer, a second IMD, and a third IMD stacked on the substrate from bottom to top in a listed sequence, wherein the dielectric layer contacts the first IMD, the first IMD contacts the second IMD, and the second IMD contacts the third IMD, and wherein the second lower plug, the second RRAM, the second upper metal line, the second logic region plug and the third logic region metal line are all entirely embedded in the third IMD, and the first lower plug, the first RRAM, the first upper metal line, the first logic region plug and the second logic region metal line are all entirely embedded in the second IMD.

12. The fabricating method of one transistor-two RRAM structure of claim 8, further comprising:

forming a third RRAM disposed in the memory region, wherein the third RRAM is embedded in the second IMD, and the third RRAM is adjacent to the first RRAM; and forming a fourth RRAM disposed in the memory region, wherein the fourth RRAM is embedded in the third IMD, and the fourth RRAM is adjacent to the second RRAM.

13. The fabricating method of one transistor-two RRAM structure of claim 12, wherein the second RRAM comprises a second body and a second spacer surrounding the second body, the fourth RRAM comprises a fourth body and a fourth spacer surrounding the fourth body, and the second spacer connects to the fourth spacer.

14. The fabricating method of one transistor-two RRAM structure of claim 13, wherein the first RRAM comprises a first body and a first spacer surrounding the first body, the third RRAM comprises a third body and a third spacer surrounding the third body, and the first plug contacts and penetrates through the first spacer and the third spacer.

15. A layout of one transistor-two resistive random access memory (RRAM) structure, comprising:
a substrate;
a transistor disposed on the substrate;
a first intermetal dielectric layer (IMD) covering the substrate;
a second IMD covering and contacting the first IMD;
a first RRAM, a second RRAM, a third RRAM and a fourth RRAM arranged in a 2×2 array, wherein the first RRAM, the second RRAM, the third RRAM and the fourth RRAM are entirely embedded in the first IMD;
a conductive element disposed at the center of the 2×2 array and penetrating through the first IMD;
a fifth RRAM entirely embedded in the second IMD;
a first lower plug disposed below the fifth RRAM and contacting the fifth RRAM; wherein the conductive element contacts the first lower plug, and the transistor, and wherein the first RRAM and the fifth RRAM together form a one transistor-two RRAM structure.

16. The layout of one transistor-two RRAM structure of claim 15, wherein the first RRAM comprises a first spacer, the second RRAM comprises a second spacer, the third RRAM comprises a third spacer, and the fourth RRAM comprises a fourth spacer, the first spacer is connected to the second spacer, the first spacer is connected to the third spacer, the fourth spacer is connected to the second spacer, and the fourth spacer is connected to the third spacer.

17. The layout of one transistor-two RRAM structure of claim 15, wherein the conductive element contacts the first spacer, the second spacer, the third spacer and the fourth spacer.

18. The layout of one transistor-two RRAM structure of claim 15, wherein the transistor electrically connects to the first RRAM, and the transistor electrically connects to the fifth RRAM.

* * * * *